(12) United States Patent
Shimono

(10) Patent No.: US 6,259,333 B1
(45) Date of Patent: Jul. 10, 2001

(54) TEMPERATURE COMPENSATION QUARTZ OSCILLATOR

(75) Inventor: Heihachi Shimono, Funabashi (JP)

(73) Assignee: Bitex Limited Company, Narashino (JP)

( * ) Notice: Subject to any disclaimer, the term of this patent is extended or adjusted under 35 U.S.C. 154(b) by 0 days.

(21) Appl. No.: 09/172,605

(22) Filed: Oct. 15, 1998

(51) Int. Cl.$^7$ ............................................. H03B 5/04
(52) U.S. Cl. .................. 331/116 R; 331/176; 331/158; 331/66
(58) Field of Search ................... 331/176, 158, 331/116 R, 66

(56) References Cited

U.S. PATENT DOCUMENTS

| | | | |
|---|---|---|---|
| 4,072,912 | * 2/1978 | Pradal | 331/116 R |
| 4,412,188 | * 10/1983 | Helle et al. | 331/176 |
| 4,607,239 | * 8/1986 | Ballato | 331/176 |

* cited by examiner

Primary Examiner—Arnold Kinkead
(74) Attorney, Agent, or Firm—Staas & Halsey LLP

(57) ABSTRACT

A system that provides an accurate frequency generating source, avoids mode coupling of the quartz vibrator, and has a high production efficiency. A high frequency amplifying circuit uses a bridge circuit as part of a feed back circuit, and a quartz vibrator is inserted in a branch side connecting the CR-circuit. The oscillation frequency is less than the serial resonance frequency of the quartz vibrator. The vibration energy is enclosed between the electrodes which prevents energy scattering to a blank edge by the oscillating quartz vibrator in a shear slipping mode with a lower frequency than the serial resonating frequency. Also, occurrence of the unnecessary shear coupling mode is restricted.

17 Claims, 6 Drawing Sheets

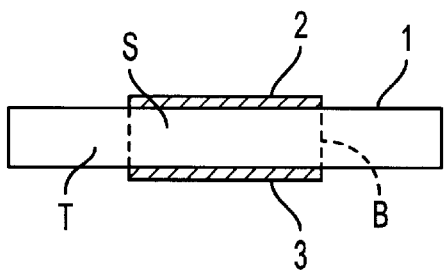
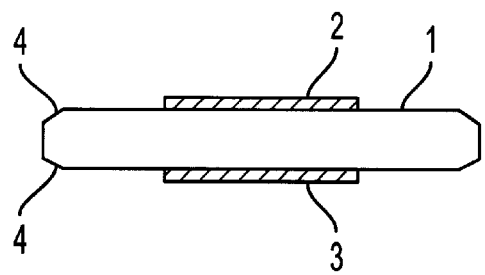
FIG. 1  FIG. 2
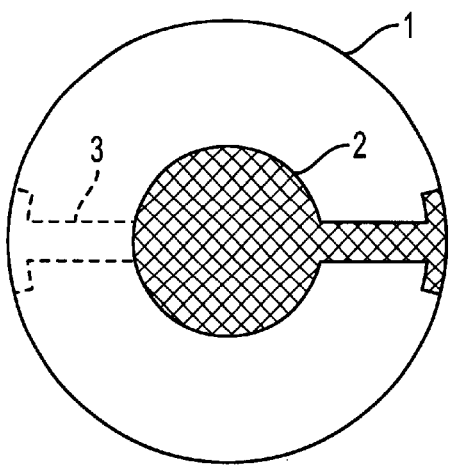
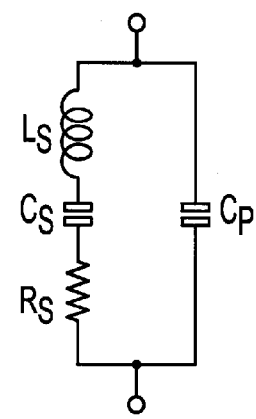
FIG. 3  FIG. 4
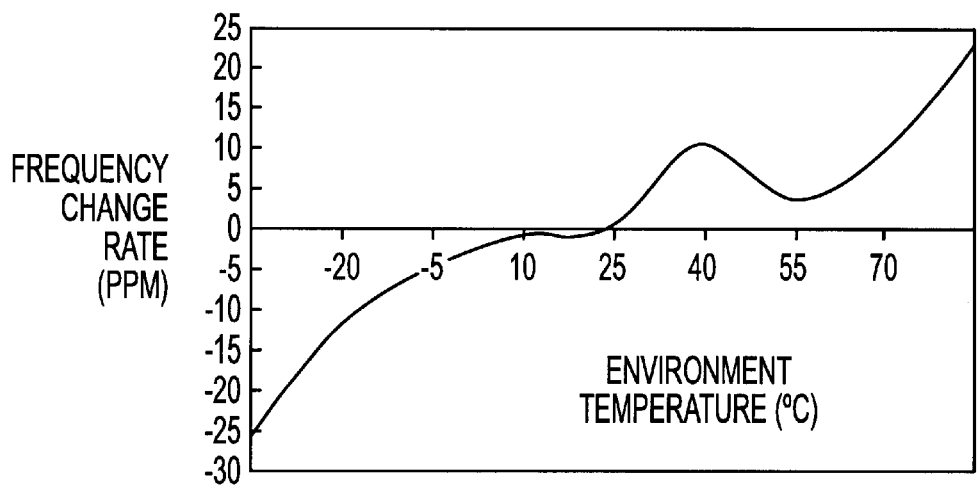
FIG. 5

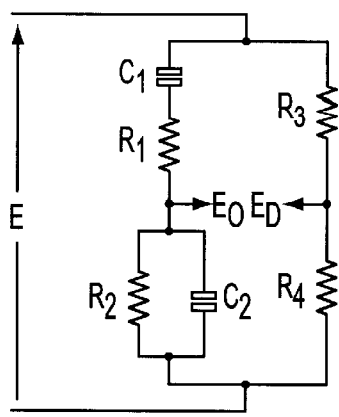
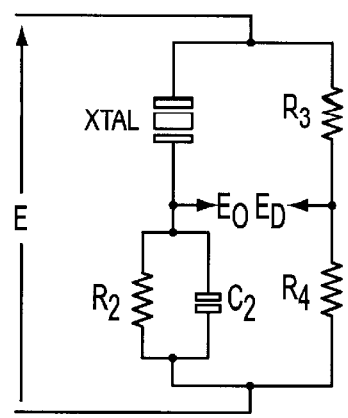
FIG. 6    FIG. 7
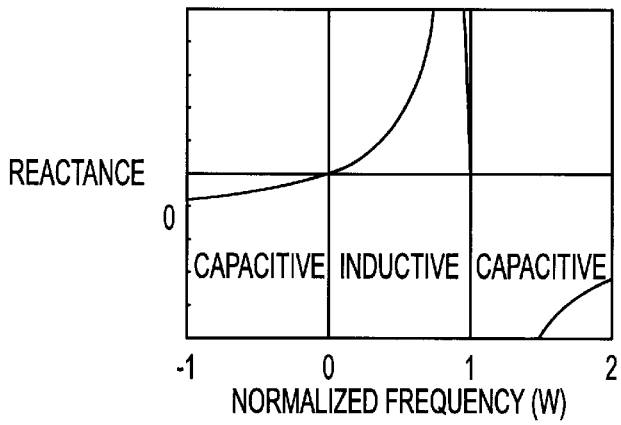
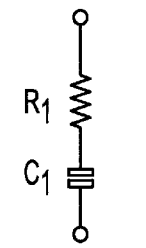
FIG. 8    FIG. 9
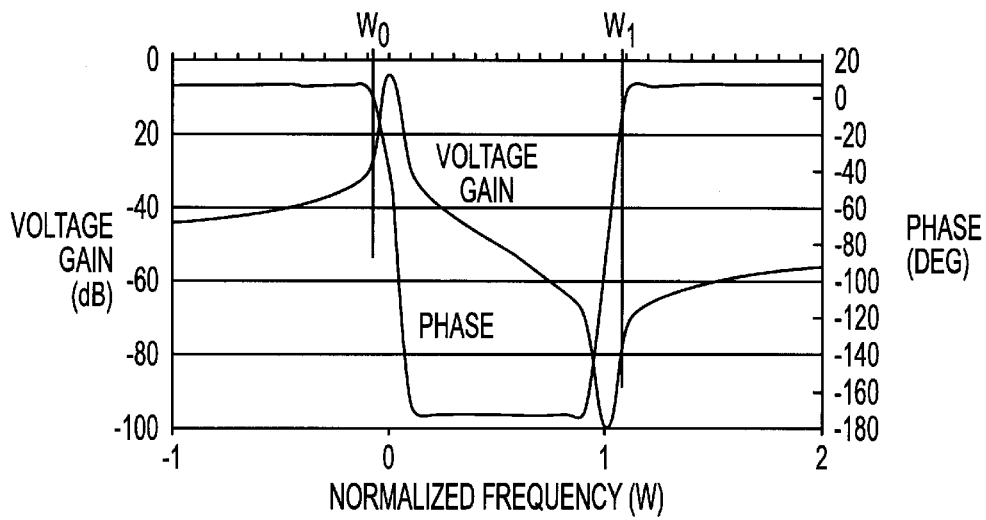
FIG. 10

TEMPERATURE COMPENSATION QUARTZ OSCILLATOR

BACKGROUND OF THE INVENTION

1. Field of the Invention

This invention relates to an oscillator. Many communication devices including handy telephone and PHS etc. are used widely for general use. Frequency accuracy used in these devices is most important, and this invention provides a quartz oscillator a highly accurate frequency for use with these devices.

2. Description of Prior Art

A quartz oscillator is used as a frequency source up to now. But the prior art crystal quartz oscillator uses an inductive region of quartz vibrator. Therefore higher frequency more than the characteristics serial resonating frequency of the quartz oscillator is generated, and many sub-frequencies are accompanied for the reason of vibrating energies propagating outside of electrode thereon.

The is an obstacle for fabricating an accurate frequency oscillation source. On the other hand, an oscillator design for decreasing the loss term of quartz vibrator is adapted to make oscillation starting of oscillation easy. This amounts to making the electrode size great, and the sub-frequency generation is increased. So it is difficult to fabricate an accurate frequency oscillation source.

Most quartz oscillators use a thickness-shear mode vibration (in following, explained as AT mode vibration). But they have a characteristic accompanying the other vibrating mode. Especially, a flexure mode vibration accompanied causes a problem that the vibration frequency is much lower than the AT mode series vibration and temperature frequency change is great. Therefore it happens for the flexure mode vibration frequency to coincide with the AT mode series vibration in any temperature within a wide range temperature. Then energy transfer occurs between both modes of vibration. This is called mode coupling, and as the result the AT mode frequency is changed suddenly.

The sudden change of frequency in AT mode has been suppressed by avoiding the coupling between the AT mode and flexure mode. It is resolved by fabrication techniques as strict management of the outline size of the quartz blank (reference number 1 of FIG. 1, FIG. 2, FIG. 3) which affects most to the flexure mode series vibration or beveling cut of the cross-section of quartz vibrator (reference number of FIG. 2) for suppressing the flexure mode vibration. However they are not essential resolving methods, and in spite of the production, management many quartz blank having the coupling mode are frequently fabricated for the reason of dispersion of outline size and beveling form of crystal blank in the fabricating process. The quartz vibrator having the mode coupling is excepted at final measuring process thereof, therefore fabrication efficiency of prior art quartz vibrator is very bad. Higher accuracy of the frequency generation source is requested, the fabrication efficiency is greatly lowered. Therefore it is difficult to keep the product quantity, as the product quantity of accurate frequency source is unstable.

SUMMARY OF THE INVENTION

This invention does not solve these problems in view of the quartz vibrator fabrication, but solves by avoiding the mode coupling in quartz vibrator by considering a principle of quartz vibration and circuit technique. An object of the present invention is to provide an accurate frequency generating source having a high production efficiency.

The fundamental characteristic of a quartz vibrator is explained in advance of explanation of a preferred embodiment. FIG. 1 shows a cross sectional view of a disk of quartz blank 1 having electrodes 2,3 at the center. AT mode vibration is caused by the shear mode vibration of the quartz. A region S is a part between the electrodes 2,3, and a region T is a part not having the electrodes. A quartz vibrator having a definite thickness has a proper vibration frequency Ft. The vibration frequency is a proper frequency of the part T. However the frequency Fs of the part S is less than the frequency Ft because of mass effect of the electrodes. Frequency difference of these frequencies (Ft−Fs) is called plate back value. AT mode vibration has a grave problem that it accompanies two kinds of sub-vibrations. One of the sub-vibrations is no-harmonics vibration group of which frequency is very near the AT mode vibration and higher than the frequency of AT mode vibration, it called generally spurious mode. The other is vibration caused by outline of quartz blank, the vibration is called flexure mode vibration. According to energy trapping theory, when a quartz vibrator is exited with frequency less than frequency Fs, the vibration within the region S is reflected totally on the boundary between region S and region T, and all energy is enclosed in the region S. When the excitation frequency is Fs<F<Ft, the vibration propagates freely in the region S, but the vibration amplitude decreases exponentially in propagation in the region T. When the excitation frequency F is F>Ft, the vibration can propagate freely in all region of the crystal blank without decreasing. Therefore the excitation frequency F is F<Ft, standing wave is occurred in the region S depending to the electrode size and many spurious vibration is excited. However, when the plate back value is restricted less than value calculated by the energy trapping theory, these spurious mode frequencies becomes less than frequency Ft, and the standing wave does not cause in the region S.

FIG. 4 shows an electrical equivalent circuit of ideal quartz vibrator which does not have the sub-frequency. In the AT mode vibration, the electrodes size does not affect to the fundamental vibration frequency. According to the approximate theory, parallel capacitor of quartz vibrator proportional to electrode area, and resistance is inverse proportion of electrode area. Prior art quartz oscillator excites the quartz vibrator in an inductive region thereof, therefore the effective resistance thereof is increased. In the prior art quartz oscillator, there is a tendency that the electrode radius is great for the reason of a strong request that the resistance Rs of quartz vibrator is set so as to start surely the oscillation. Under this condition, the oscillation frequency Fo is Fs<Fo<Ft, and a portion of the oscillation energy propagates the blank through the boundary and reaches to the end. As mentioned above, vibration decreases exponentially in propagation within the region T. However, when the electrode size is greater comparative to the size of the region T, enough energy rests at the end of blank. Thickness-shear mode vibration is excited in blank, during the vibration propagation thereof, transverse wave propagating to radius direction of the blank. Therefore the second sub-vibration series of flexure mode series vibration is caused.

FIG. 5 shows an example of frequency change of AT fundamental mode to temperature change. A definite radius blank causes flexure mode vibration. The flexure mode vibration is lower than AT mode frequency, and the frequency variation by temperature change is much greater than that of AT mode. As the result, a part of harmonics of the flexure mode vibration coincides with the AT fundamental frequency at a temperature, and causes mode coupling. The actual measured example of FIG. 5 shows a mode coupling at about 40° C. This is measured between −35° C. and +85° C. and step of 15° C., and detail change is not clear at the temperature causing the mode coupling. However, such a sudden change of frequency shown in FIG. 5 cannot be compensated with usual frequency compensation circuit. On the hand, equivalent resistance Rs of AT mode increases sharply by the mode coupling. The rapid increase of resistance happens to stop the quartz vibration temporarily.

It is known that the mode coupling is weak under the condition of low power excitation of quartz vibrator for the reason of decrease of energy for exciting the flexure vibration. However it happens that quartz oscillator excited with such a low energy does not restart, when it had been stopped during a period. It is called as a difficult starting characteristic of quartz vibrator. It means that the equivalent resistor Rs increases when the quartz vibrator has been stopped during a period. In this case the Rs recovers to ordinary value after it restarts. But it is nonsense discussion in case of no possibility of restarting.

Means for solving the problem have been obtained from deep consideration for the above mentioned principle of quartz vibrator. The means is composed of the following.

(1) Excitation frequency is lower than the serial resonating frequency Fs of the region S of crystal quartz, that is the vibration is excited in a capacitive region of a quartz vibrator.

(2) Electrode size (diameter) is much smaller than that used in prior art. This makes the serial resistance Rs of quartz vibrator great, but an oscillation circuit no having difficult starting characteristic and continuing stable oscillation can be realized.

(3) Crystal quartz vibrator is fabricated so that the plate back value is less than that calculated from the energy trapping theory. This means (3) is executed already in general at this time.

As this invention is composed of the above mentioned means, it acts as following.

As the quartz oscillator of this invention oscillates in less frequency Fo than the serial resonating frequency Fs of the region S from the above mentioned means (1), the vibration energy is completely enclosed in the electrode area. Further the quartz oscillator of this invention does not cause the spurious mode resonance from the oscillation energy from the above mentioned means (3). On the other hand possibility causing the flexure mode oscillation is much smaller than the prior art quartz vibrator, the flexure mode oscillation does not occur substantially in this invention.

BRIEF DESCRIPTION OF THE DRAWING

FIG. 1 shows a cross sectional view of quartz vibrator.

FIG. 2 shows a cross sectional view of quartz vibrator processed of beveling.

FIG. 3 shows a plane view of quartz vibrator.

FIG. 4 shows an equivalent circuit of quartz vibrator.

FIG. 5 shows Resonance frequency temperature characteristic of mode coupling.

FIG. 6 shows a Wien bridge circuit.

FIG. 7 shows a bridge circuit Wien bridge having quarts vibrator in one side.

FIG. 8 shows reactance frequency characteristic of quartz vibrator.

FIG. 9 shows CR equivalent circuit of quartz vibrator in capacity region.

FIG. 10 shows voltage gain and phase characteristic of the first bridge side and the second bridge side.

DESCRIPTION OF THE PREFERRED EMBODIMENT

Figure 11:
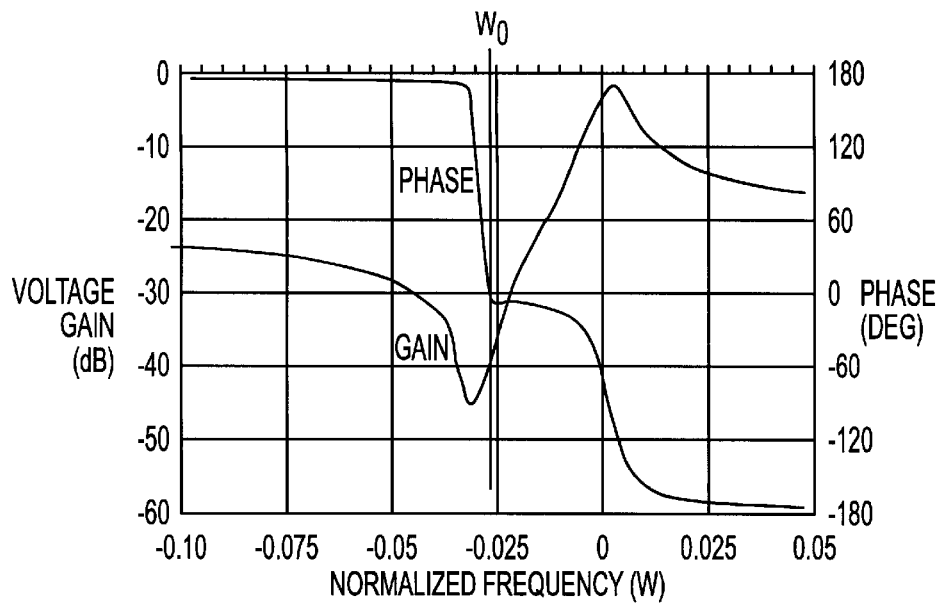
FIG. 11 shows voltage gain and phase characteristic between bridge output terminal (Ea,Eb).

This invention provides a high frequency amplifying circuit in which a bridge circuit is used as a part of feed back circuit; and a quartz vibrator is inserted in a branch side of CR-circuit obtained by equivalent conversion of the bridge circuit for oscillating with frequency lower than the serial resonance frequency of the quartz oscillator.

The quartz vibration of this invention is excited in capacitive range and the oscillation frequency is less than the resonance frequency of the quartz vibrator. Frequency change caused from environmental temperature change of the quartz vibrator may be compensated with change of resistance R in different side from the bridge side having quartz vibrator according to the environmental temperature. And a part of the capacitor C of this bridge side is used for regulating room temperature deviation of oscillation frequency.

Embodiments are explained by referring each figures.

FIG. 6 is Wien bridge circuit. The first side is CR serial circuit, the second circuit is CR parallel circuit, the third side and the fourth side is registor R. FIG. 7 shows a circuit that the CR serial circuit of the first circuit is replaced with a quartz vibrator. FIG. 8 shows a reactance characteristics of quartz vibrator being known widely. The equivalent circuit is capacitive in region w<0 of normalised frequency (mentioned later) of the present invention. In this condition, the equivalent circuit of FIG. 4 is shown as FIG. 4.

When impedance of the quartz vibrator inserted in the first side and the second side is each $Z_1$, $Z_2$, $Z_1$, $Z_2$ is shown as following, $$Z_1 = \frac{\frac{1}{j\omega Cp}\left(Rs + j\left(\omega Ls - \frac{1}{\omega Cs}\right)\right)}{Rs + j\left(\omega Ls - \frac{1}{j\omega Cs}\right) + \frac{1}{j\omega Cp}} \tag{1}$$

$$Z_2 = \frac{\frac{R_2}{j\omega C_2}}{R_2 + \frac{1}{j\omega C_2}} = \frac{R_2}{1 + j\omega C_2 R_2}$$

Then, variable is defined as following $$\Omega s^2 = 1/(LsCs),\ \Omega s = \omega Ls/Rs,\ m_1 = \omega sCpRs,\ m_2 = \omega sC_2R_2,\ \Omega = \omega/\omega s, \\ X = \Omega - 1/\Omega \tag{2}$$

If output impedance of the amplifier is as small as negligible, then voltage ratio A=Ea/E is calculated as A=$Z_2$/($Z_1+Z_2$).

Therefore A is calculated as following by using the variable.

$$A = \frac{Ea}{E} = \frac{(1-w)R_2 + jm_1 R_2 \Omega}{\left(1 - \frac{m_2}{m_1}Rs\right) + (1-w)R_2 + j\{(QsXRs + (m_2Rs + m_1R_2)\Omega\}} \tag{3}$$

where $a = (1-w)R_2$, $b = m_1 R_2 \Omega$, $$c = \left(1 - \frac{m_2}{m_1}w\right)Rs + (1-w)R_2,$$

$d = QsXRs + (m_2Rs + m_1R_2)\Omega$ then, the phase of vector A is A=(a+jb)/(c+jd).

Therefore, the phase of vector A is following:

$$\phi = \tan^{-1}\frac{bc - ad}{ac + bd}\ \text{(radian)} \tag{4}$$

For input voltage E and Ea is same, φ=o, namely bc−ad=0 is necessary. From this condition next second order equation is derived.

$$m_1 Qs^2(\Omega^2-1)^2 - \{Qs + (m_2-m_1)\}(\Omega^2-1) - (m_2-m_1) = 0$$

where $(m_2-m_1) <<< Qs$, therefore the above equation is following:

$$m_1 Qs^2(\Omega^2-1)^2 - Qs(\Omega^2-1) - (m_2-m_1) = 0 \tag{5}$$

The resolution is obtained as following, $$m_1 Qs(\Omega^2-1) = \frac{1}{2}\{1 \pm \sqrt{1+4m_1(m_2-m_1)}\} \cong \frac{1}{2}\{1 \pm 2m_1 m_2\} \tag{6}$$

And $m_1 Qs^2(\Omega^2-1)$ is calculated as following:

$$m_1 Qs(\Omega^2 - 1) = \omega s^2 LsCs\frac{Cp}{Cs}(\omega+\omega s)\frac{(\omega-\omega s)}{\omega \omega s} \tag{7}$$

$$\cong 2\gamma\omega - \frac{\omega s}{\omega s}$$

$$= 2\gamma f - \frac{fs}{fs}$$

where γ is called as capacitor ratio of crystal quartz vibrator, and γ=Cp/Cs.

$$w = 2\gamma(f-fs)/fs \tag{8}$$

This is called a normalised frequency. Therefore, from equation (6) the normalised frequency of same phase of E and Ea has two roots $w_0 = m_1 m_2$, $w_1 = 1 + m_1 m_2$. $w_0$ corresponds to frequency a little less than serial resonance frequency fs, and $w_1$ corresponds to frequency a little higher than parallel resonance frequency.

FIG. 10 shows normalised frequency versus voltage gain A, for fs=12.8 MHz, Qs=$10^5$, Cs=4.57 pF, Rs=39Ω, Cp=1 pF, $C_2$=330 pF, $R_2$=315Ω, $m_1$=0.003135, $m_2$=8.37685. Considering from the voltage gain A and the phase of FIG. 10, attenuation of the Gain A is great at $w_1$, therefore it would be understood for the frequency to be impossible for oscillation. On the other hand, because the attenuation is small at $w_0$, the oscillation may be excited by incorporating the bridge circuit of FIG. 6. Because the third side and the forth side are each composed of resistor, the phase of partial voltage Eb is same with phase of voltage E. So, in case of phase E and Ea are same, phase of Ea and Eb are same, and when the voltages of Ea and Eb are same, the bridge circuit has a deep attenuation pole. FIG. 11 shows voltage gain, phase of voltage E and voltage (Ea−Eb) of bridge circuit versus normalised frequency, Considering the phase characteristic in FIG. 7, the phase rotation is slow in a region higher than normalised frequency $w_0$ being 0 phase, therefore it is understood that the frequency stability of oscillator incorporated the bridge circuit of FIG. 7 is unstable.

A quartz vibrator has an odd number overtone vibration mode in addition to the basic vibration mode. Now, calculating the normalised oscillation frequency for the third order overtone by using the above-mentioned circuit constant value, it is obtained as following.

$$w_0^{(3)} = -3\omega s \times Cp \times (3^2 \times Rs) \times 3\omega s \times C_2 \times R_2 = -81 \times m_1 m_2 \tag{9}$$

This calculation result is lower of 81 times than the normalised oscillation frequency corresponding to the basic wave, therefore gain A=Ea/E attenuates greatly and oscillation of the overtone mode is impossible.

Figure 12:
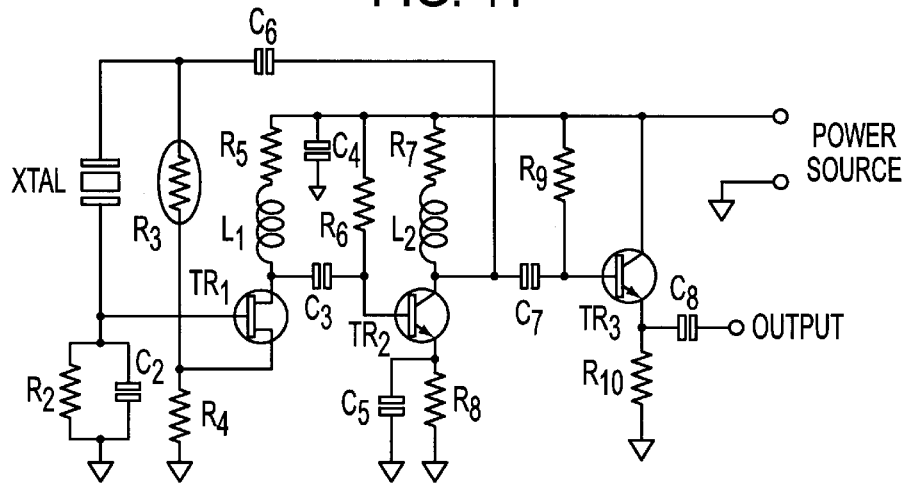
FIG. 12 shows an oscillation circuit using transistor.
Figure 13:
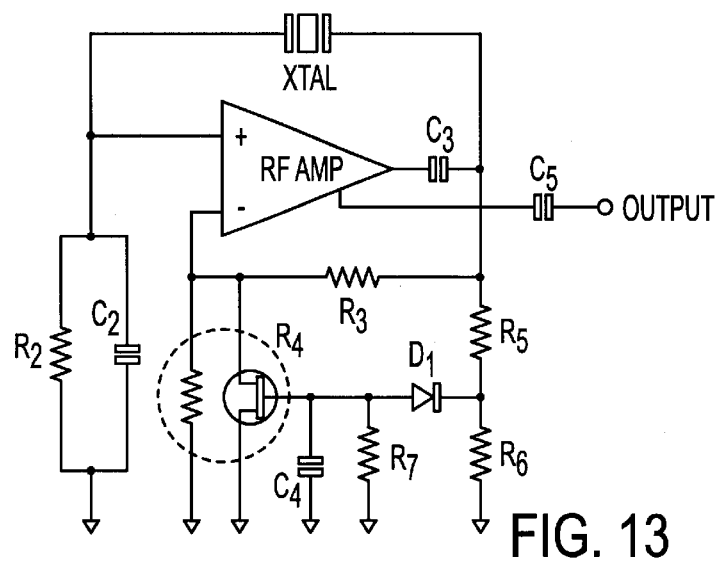
FIG. 13 shows an oscillation circuit using integrated circuit.
Figure 14:
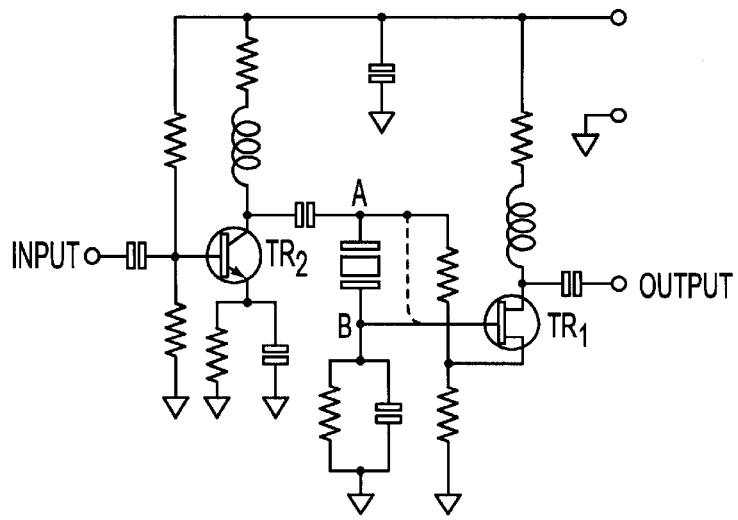
FIG. 14 shows a circuit for testing loop transmission circuit.
Figure 15:
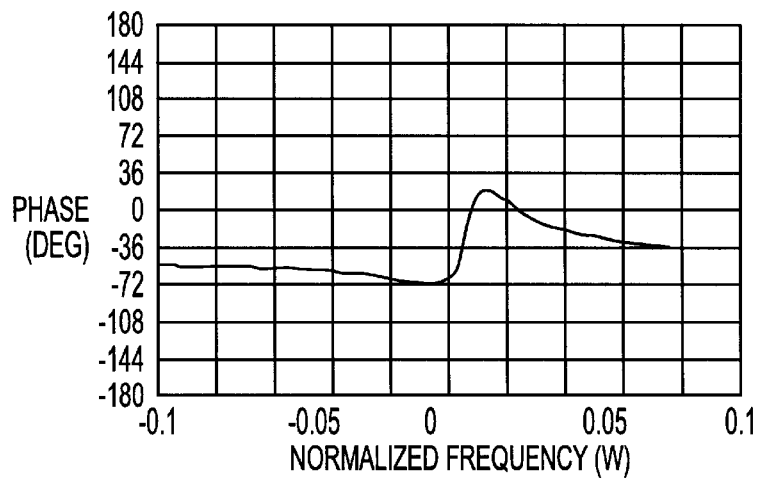
FIG. 15 shows loop phase characteristic of a circuit that input of TR1 is connected to A point in FIG. 14.

FIG. 12 shows a transistor amplifier, and FIG. 13 shows an oscillator circuit of IC amplifier circuit incorporated this invention bridge circuit. In ordinary bridge, sides of resistors are usual resistor $R_3$ and $R_4$, but a negative temperature coefficient thermistor is used as resistor R3 in circuit of FIG. 12. In FIG. 13, FET is used as variable resister in FIG. 13. They are used for automatic gain control means. Output of the amplifier is fed back to the bridge circuit with same phase. By the way because a capacitive bridge circuit is loaded on the output of the amplifier, a great phase rotation is caused and phase of the amplifier is greatly changed as shown in FIG. 15. The phase rotation of example of the FIG. 15 is about 70° at near frequency and the change is loose. Phase characteristic of FIG. 15 is obtained by calculation base on FIG. 14. The circuit of FIG. 14 shows a circuit that is cut between transistor TR1 step and $R_2$ step, and input signal is input to the base of the transistor TR2 and output signal is output from the collector of TR1. Namely, FIG. 14 shows a loop transmission characteristic of circuit of FIG. 12.

Figure 16:
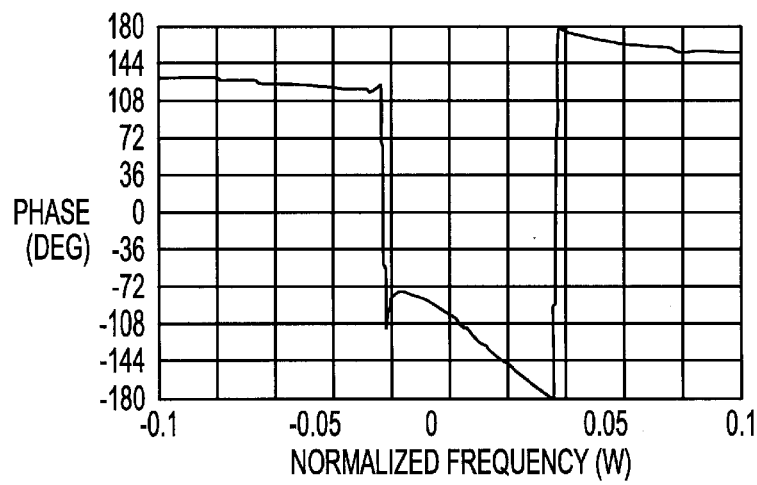
FIG. 16 shows loop phase characteristic of circuit input of TR1 is connected to B point in FIG. 14.

For obtaining a phase rotation effect of circuit of which load is full a bridge circuit, measurement or calculation is executed by connecting the base input of transistor TR1 to A point instead of B point on FIG. 14. The result is shown in FIG. 15. FIG. 16 shows a loop phase characteristics calculated from connecting the base of transistor TR1 to B point. As shown the figure the loop phase characteristic is that phase characteristic 70° is added to phase characteristic of the bridge unit, and the phase change rises and falls sharply centered 0°. It means a small change of frequency may compensate the phase deviation and frequency change caused by change of circuit constant.

Figure 17:
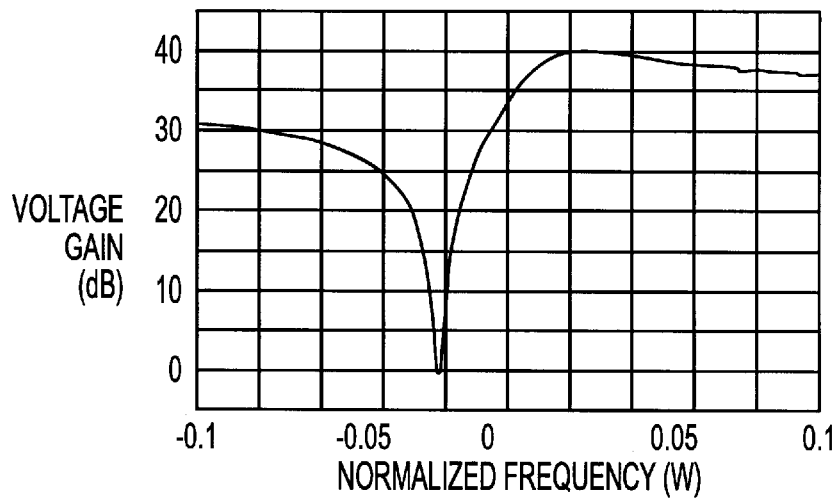
FIG. 17 shows loop gain characteristic of a circuit that input of TR1 is connected to B point in FIG. 14.

FIG. 17 shows a loop gain a of circuit which connects an input of TR1 to B point in FIG. 14. Gain of balance point of the bridge circuit at phase of 90° has a dip, and when the gain of the dip point is o db, oscillation is caused. The oscillation mechanism is same with that of Wien bridge CR oscillator known widely. Therefore it is not mentioned, but it is explained that the above mentioned difficult starting characteristic of quartz oscillator may be resolved by this invention. It happens sometimes for a low level energy oscillator not to start oscillation, because of increase of resistance R during resting period of quartz oscillator as mentioned above. The resistance Rs of this invention oscillator is equal to the bridge resistance $R_1$ (it changes a little corresponding to normalised frequency $w_0$, however during usual range of w0<<1, Rs≈Rs).

If Rs, namely $R_1$ increases and voltage Ea falls down, and the oscillation could not start, the resistor of the thermistor of FIG. 13 increases, or resistor value of FET of FIG. 13 decreases. So voltage Eb decreases at the same time and the voltage difference (Ea−Eb) is not changed or increases. As the result oscillation can start. Once the oscillation starts, and the resistor Rs returns to ordinary value, the thermistor R3 and the FET controls automatically the gain control.

As mentioned above, a quartz oscillator which does not cause the flexure mode oscillation can be realized by this invention, as the result that quartz vibrator vibrates in the capacity range and AT mode oscillation is enclosed in electrode region, and that makes the electrode size on quartz vibrator minimum so that the resistance Rs of quartz does not effect to starting characteristic of oscillation.

Next a means for frequency temperature compensation is explained.

Figure 18:
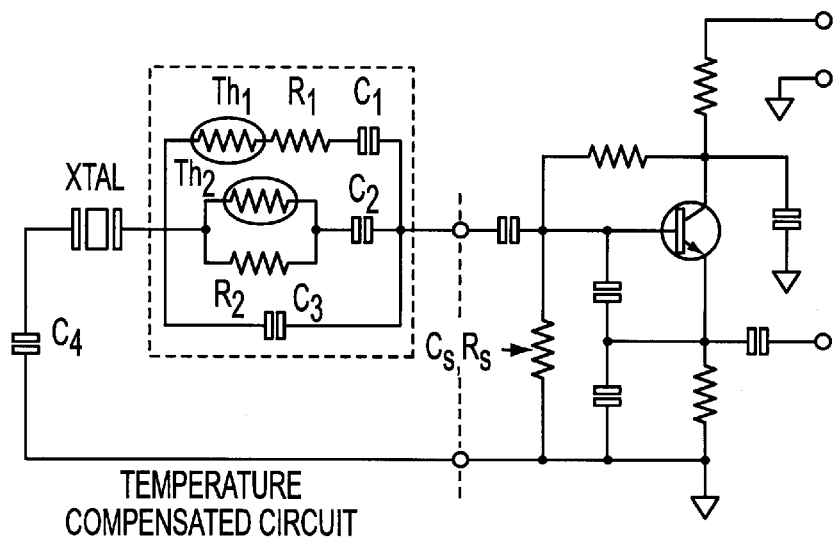
FIG. 18 shows frequency temperature compensation method of prior quartz oscillator.
Figure 19:
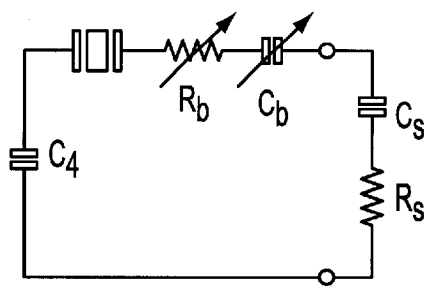
FIG. 19 shows equivalent circuit of FIG. 18.

FIG. 18 shows an example of an oscillation circuit containing frequency temperature compensation circuit. In this example, a compensation circuit composed of negative temperature coefficient thermistors $Th_1, Th_2$, capacitor $C_1, C_2, C_3$ and fixed resistor $R_1, R_2$ is connected serially to quartz vibrator. When seeing the oscillation circuit from the quartz circuit of FIG. 18, FIG. 18 is converted to FIG. 19 for equivalent capacitance of oscillator Cg, equivalent negative resistor Rg. In the circuit of FIG. 19, a temperature compensation circuit of FIG. 18 is converted equivalently to Rb,Cb. As shown in FIG. 19, the temperature frequency change is compensated from changing the capacitance Cb effectively by thermistor resistance strongly depending to temperature.

But the prior art temperature compensation means for the oscillation circuit has a problem that its effective resistance Rb is great and stops the oscillation. Therefore sufficient effective resistance is requested. This results the low effective resistance, at a high temperature region, and because of signal saturation in an oscillation active element, large distortion of oscillation is caused. On the other hand, there is other problem, which is tending to be overlooked, that the action level of oscillator changes by change of effective resistance Rb and as the result the equivalent capacitance Cg changes nonlinearly. It affects the oscillation frequency. As an example the change is from two times to three times of the specific capacity (20 pF). Therefore it is impossible to compensate the temperature characteristic of quartz oscillator only by the temperature compensation circuit of FIG. 18, and effective compensation cannot be obtained. It must consider change of the equivalent capacitor Cg of oscillator for more effective compensation, therefore it is a difficult problem. Additionally oscillator of FIG. 18 oscillates in higher frequency than the serial resonance frequency of quartz vibrator, so there is a deficiency causing mode coupling. Therefore quartz vibrator which has no mode coupling in itself must be selected and used in an oscillator.

Figure 20:
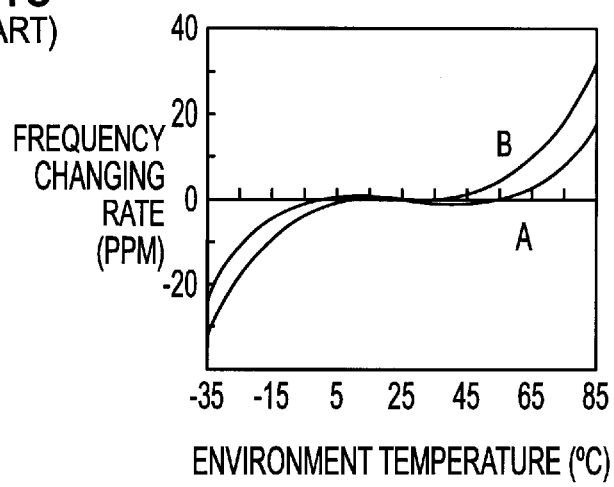
FIG. 20 shows resonance frequency characteristic of quartz oscillator no having mode coupling.

FIG. 20 shows two examples of third order temperature characteristic of quartz vibrator not having mode coupling. A curved line B shows characteristic that changing rate is 0 at room temperature of 25° C. and increases monotonously, a curved line A shows characteristic having 3 points of temperature that changing rate is 0. The prior art quartz oscillator mentioned above is difficult for compensating the temperature for the curve line A.

Temperature compensation means of this invention is explained.

Oscillation frequency of quartz oscillator of this invention is obtained from equation (6), (7)

$$fo = \left(1 + \frac{1 - \sqrt{1 + m_1 m_2}}{4\gamma}\right) fs \cong \left(1 - \frac{m_1 m_2}{2\gamma}\right) fs \tag{10}$$

where $m_1 = 2\pi fsCpRs$, $m_2 = 2\pi fsC_2R_2$

Namely oscillation frequency depends on is Fs,Cp,Rs,$C_2$ and $R_2$. It should be noted that the four circuit constants are independent element for deciding oscillation frequency. Only the capacitance is a frequency decision element in the aforementioned oscillator of prior art, however resistance is the decision element in this invention. This is an important difference point from the prior art quartz oscillator which changes the resistance indirectly by changing capacitor C. Additionally the compensation for the curved line A of FIG. 20 having been difficult in prior art is easy in this invention.

Figure 21:
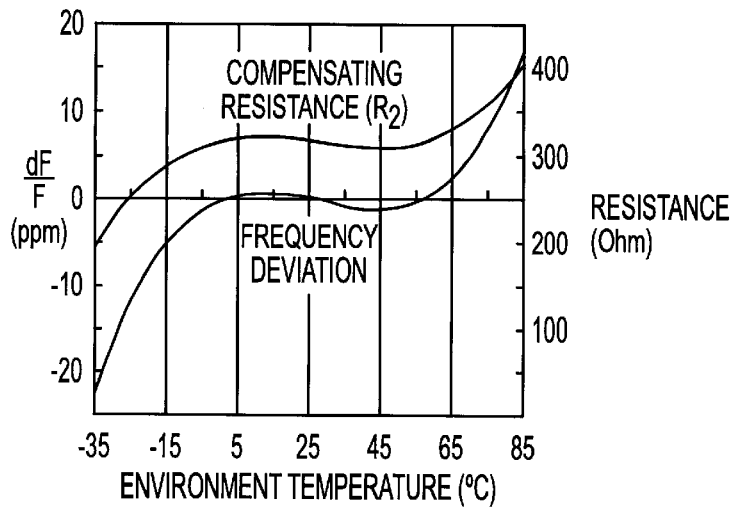
FIG. 21 shows an example of resonance frequency temperature characteristic and compensation resistor characteristic.

Mathematical relation is explained now for explaining the temperature compensation. Frequency deviation shown FIG. 21 corresponds to the curved line A of FIG. 20. Nominative oscillation frequency fn must be lower than resonance frequency fs. The frequency deviation of FIG. 21 is the lowest of −23 ppm at −35° C. Therefore the resonance frequency fso at room temperature 25° C. should be set marginally for fn. For the deviation margin is po ppm, the relation fn and fso should be fso=(1+po×10⁻⁶)×fn. Therefore the normalised oscillation frequency is obtained following equation.

$$w0 = 2\gamma(fn - fso)/fso \tag{11}$$

Therefore $m_1 \times m_2$ is determined from following formula.

$$m_1 m_2 = w_0(w_0 - 1) \tag{12}$$

where $m_1 = 2\pi$ fsCpRs is a circuit constant and it is supposed as known. On the other hand, $m_2 = 2\pi$ fsC$_2$R$_2$ is selected freely in a degree. When frequency temperature changing rate of quartz vibrator of which deviation is o measured at room temperature 25° C. is pm ppm, a resonance frequency fs of any temperature may be obtained from following equation.

$$fs = (1 + pm \times 10^{-6}) \times fso \tag{13}$$

And letting set $C_2$, and calculating resistance $R_2$ for exciting constant oscillation frequency $f_0$ in nominative value fn.

$$R_2 = -2\gamma fn - \frac{fa}{fs} \times \frac{1}{m_1} \times \frac{1}{2\pi fsC_2} \quad (14)$$

$R_2$ calculated each temperature is called as compensating resistance, and is shown in FIG. 21. Namely when the resistor $R_2$ of the second bridge side of FIG. 7 varies as shown, the resonance frequency is kept at the nominative value fn. If a compensation characteristic approximated to the compensation characteristic of $R_2$ is obtained by any means, oscillation frequency fo based on it may be obtained from formula (10).

$$df/fn=(f_0-fn)/fn \quad (15)$$

This invention is explained by numerical embodiment frequency deviation pm=df/f is calculated for temperature t(° C.) as following.

$$pm=1.163\times10^{-4}\times t^3-9.645\times10^{-3}\times t^2+0.174\times t-0.1422$$

Because of the deviation at −35° C. is −23 ppm, and setting the deviation po to 60 ppm, the resonant frequency of quartz vibrator fso at room temperature 25° C. is following.

$$fso=(1+po\times10^{-6})\times fn=12800768 \text{ Hz.}$$

The normalised frequency wo is obtained from equation (11),(12), $$wo=-0.02628, m_1m_2=0.02697.$$

As $m_1=2\pi$ fsCpRs is known as quartz constant, setting $m_1=3.1367\times10^{-3}$. And setting c2=330 pF, the compensated resistor $R_2$ is obtained from equation (13),(14).

Figure 22:
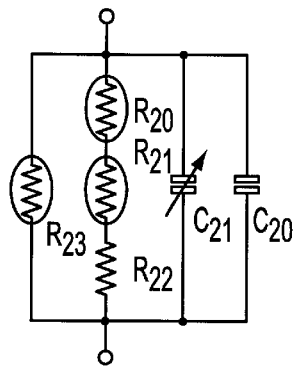
FIG. 22 shows an example of resistor circuit for realizing compensation resister characteristic.
Figure 23:
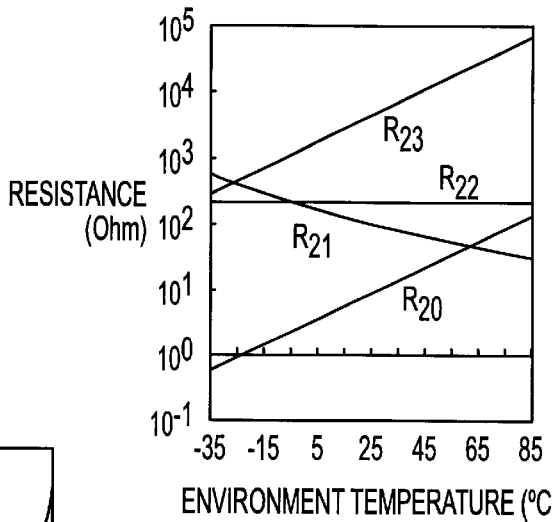
FIG. 23 shows temperature characteristic of resistor element of FIG. 22.

FIG. 22 shows a circuit of the second bridge invented for obtaining temperature characteristics of compensation resistance $R_2$ in FIG. 7. This resistor circuit is composed of two positive temperature coefficient thermistor $R_{20},R_{23}$ and one negative temperature coefficient thermistor $R_{21}$ and constant resistor $R_{22}$, each characteristics is shown in FIG. 22. As shown in the figure, $R_{20}$ and $R_{23}$ are positive temperature coefficient thermistor, and they are different only for the resistance at 25° C. These thermistors are available for temperature compensation and about two figures are changed per 100°0 C. The resistor circuit is set for all resistance to be 315Ω at 25° C., and under this condition the capacities $C_{20}$, $C_{21}$ are adjusted so that the deviation is 0. Outline characteristic of the circuit of FIG. 22 for temperature is following.

At low temperatures, because the resistance of the branch is great by the thermistor $R_{21}$, main characteristic is determined by the positive coefficient thermistor $R_{21}$, and the resistance decreases according to the temperature decreasing. At middle temperature region, because $R_{23}$ is great and $R_{20}$ is yet small, main characteristic is determined by the negative temperature coefficient thermistor $R_{21}$, and when temperature increasing, the whole resistance temperature characteristic is negative temperature coefficient as the result. At high temperature range, as $R_{23}$ is much great, so it does not relate generally to the characteristic, and $R_{21}$ is very small, and the characteristic is determined mainly by the positive temperature coefficient thermistor $R_{20}$, and the whole resistance increases. Therefore a good approximate temperature compensating characteristic may be obtained by deciding the resistance constant. Because the approximate characteristic is very near to the original and it is not distinctive in the graph size, it is not shown in FIG. 21.

The temperature compensation of the prior art quartz oscillator is compensated only in low temperature range and high temperature range, but temperature compensation of this invention is compensated in three zone of low temperature, middle temperature and high temperature, therefore the accuracy of compensation is remarkably improved.

Figure 24:
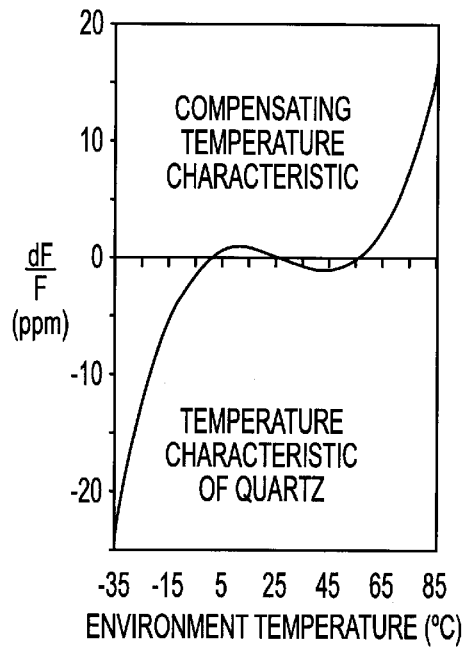
FIG. 24 shows resonance frequency temperature characteristic of quartz and temperature characteristic of oscillation frequency.

FIG. 24 shows a frequency temperature characteristic of quartz vibrator itself and a frequency temperature compensation characteristic in a circuit of FIG. 22. It shows that compensation of less than 1 ppm over −35° C.–85° C. is realized. However for the compensation for all range of more wide temperature range of quartz vibrator, the compensation is not clear When the temperature characteristic of quartz is different from the above mentioned characteristic, it would happen that an another circuit net different from the FIG. 22 is necessary, or the compensation will be impossible. However there is not the coupling mode in incorporated in the oscillator, therefore a quartz vibrator having good temperature characteristic can be selected in state of the unit quartz vibrator before incorporated to the oscillator.

This invention has following effects the above mentioned composition.

Because quartz vibrator vibrates in a capacitive range, vibration energy is enclosed in the region S between electrodes. So spurious resonance does not occur and oscillation frequency jumping to the spurious resonance point does not occur.

In this invention, the resistance of quartz vibrator does not relate directly to the starting action of oscillation, so the electrode diameter of quartz blank is small and does not cause the mode coupling of flexure mode vibration.

As it is ensured in principle of this invention that mode coupling does not occur, accurate management of outline size and beveling process of the quartz blank in production is not necessary. And fine temperature test to detect mode coupling mode vibration is not necessary for quartz vibrator.

The gain controller of this invention of quartz oscillation resolves the difficult starting of oscillation which has been caused in the prior quartz oscillator by resistance increase in resting period of oscillation.

Because the capacity of bridge circuit and resistor of bridge circuit decide oscillation frequency independently each other, the temperature compensation is possible only by changing the resistance.

Frequency temperature compensation is acted by changing both resistance of positive temperature coefficient thermistor and negative temperature coefficient thermistor. Therefore the accurate temperature compensation is possible by partitioning the compensating region to a low temperature region, middle temperature region and high temperature region.

What is claimed is:

1. An oscillator apparatus comprising:
    a high frequency amplifying circuit having a feed back loop comprising a Wien bridge circuit, with a quartz vibrator connected in a branch side of the Wien bridge replacing a serial resistor and capacitor on one branch of a standard Wien bridge; and
    a circuit constant of the bridge circuit being determined so an oscillation frequency is lower than serial resonance frequency of the quartz vibrator.

2. An apparatus as recited in claim 1, further comprising:
    a frequency temperature compensating circuit comprising a resistor and a capacitor being set in a branch side different from the quartz vibrator branch side,
    and the resistor being a thermistor compensating frequency temperature change of the quartz vibrator.

3. An apparatus as recited in claim 2, further comprising:
the frequency temperature compensating circuit including resistors comprising a positive coefficient thermistor and a negative coefficient thermistor, the thermistors compensating temperature characteristics of the quartz oscillator varying nearly with a third order function.

4. An oscillator comprising:
a high frequency amplifying circuit having a feedback loop including a bridge circuit having a first branch side and a second branch side;
a quartz vibrator set in the first branch side of the bridge circuit; and
a capacitor and a temperature dependent resistor being set in the second branch side of the bridge circuit,
wherein a circuit constant of the bridge circuit is set so that an oscillation frequency is lower than a serial resonance frequency of the quartz vibrator.

5. The oscillator recited in claim 4, wherein the temperature dependent resistor comprises a thermistor.

6. A crystal oscillator containing a bridge circuit and a high frequency amplifier comprising:
a first terminal connecting a first side of the bridge circuit and a second side of the bridge circuit;
a second terminal connecting a third side of the bridge circuit and a fourth side of the bridge circuit;
a third terminal connecting the first side of the bridge circuit and the third side of the bridge circuit;
a fourth terminal connecting the second side of the bridge circuit and the fourth side of the bridge circuit;
a crystal vibrator on the first side of the bridge circuit;
a parallel circuit containing a resistor and a capacitor on the second side of the bridge circuit;
a first resistive impedance on the third side of the bridge circuit;
a second resistive impedance on the fourth side of the bridge circuit;
a first input of a high frequency amplifier connected to the first terminal;
an output of the high frequency amplifier connected to the third terminal;
a second input of the high frequency amplifier connected to the second terminal; and
the fourth terminal connected to a ground.

7. A crystal oscillator as recited in claim 6, wherein the resistor on the second side comprises a thermistor.

8. A crystal oscillator as recited in claim 7, wherein the resistor on the second side comprises a positive coefficient thermistor and a negative coefficient thermistor, the thermistors compensating temperature characteristics of the crystal vibrator varying nearly with a third order function.

9. A quartz oscillator comprising:
a Wien bridge circuit having a first side, second third, third side, and fourth side;
a quartz vibrator connected to the first side;
a parallel resistor and capacitor connected to the second side;
a first resistor connected to the third side;
a second resistor connected to the fourth side; and
a high frequency amplifier with a first input and an output, the first input and the output both connected to opposite sides of the quartz vibrator, thereby forming a positive feedback loop,
wherein an oscillation frequency of the quartz vibrator is less than the serial resonating frequency of the quartz vibrator.

10. A quartz oscillator as recited in claim 9, further comprising:
a first connecting node connecting the first side to the second side;
a second connecting node connecting the third side to the fourth side;
a third connecting node connecting the first side to the third side;
a fourth connecting node connecting the second side to the fourth side; and
a second input connected to the high frequency amplifier, the first input and output both operate on a same phase while the second input and the output both operate on inverse phases,
wherein
the output is connected to the third connecting node,
the first input is connected to the first connecting node, thereby making a positive feedback loop,
the second input is connected to the second connecting node, thereby making a negative feedback loop.

11. A quartz oscillator as recited in claim 9, wherein a resistor in the parallel resistor and capacitor connected to the second side comprises a thermistor.

12. A quartz oscillator as recited in claim 11, wherein the resistor in the parallel resistor and capacitor connected to the second side is further connected in parallel with a positive temperature coefficient thermistor in parallel with a negative temperature coefficient thermistor.

13. An apparatus as recited in claim 1, further comprising a parallelly connected resistor and capacitor as in a standard Wien bridge, the parallelly connected resistor comprising a temperature dependent resistor compensating frequency temperature changes of the quartz vibrator.

14. An apparatus as recited in claim 13, wherein the temperature dependent resistor comprises a positive coefficient thermistor and a negative coefficient thermistor, the thermistors compensating temperature characteristics of the quartz vibrator varying nearly with a third order function.

15. A crystal oscillator as recited in claim 6, wherein
an oscillation frequency of the crystal vibrator is less than a serial resonating frequency of the crystal vibrator,
the first input and output of the high frequency amplifier operate on same phases, thereby making a positive feedback loop, and
the second input and the output of the high frequency amplifier operate on inverse phases, thereby making a negative feedback loop.

16. A crystal oscillator as recited in claim 15, wherein the resistor on the second side comprises a thermistor.

17. A crystal oscillator as recited in claim 16, wherein the resistor on the second side comprises a positive coefficient thermistor and a negative coefficient thermistor, the thermistors compensating temperature characteristics of the crystal vibrator varying nearly with a third order function.

* * * * *